(12) United States Patent
Zhu et al.

(10) Patent No.: US 11,309,682 B2
(45) Date of Patent: Apr. 19, 2022

(54) MILLIMETER WAVE LTCC FILTER

(71) Applicant: AAC Technologies Pte. Ltd., Singapore (SG)

(72) Inventors: Zhimin Zhu, Shenzhen (CN); Jianchun Mai, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 361 days.

(21) Appl. No.: 16/703,789

(22) Filed: Dec. 4, 2019

(65) Prior Publication Data

US 2020/0212648 A1 Jul. 2, 2020

(30) Foreign Application Priority Data

Dec. 31, 2018 (CN) .......................... 201811650618.7

(51) Int. Cl.
*H01L 23/00* (2006.01)
*H01S 5/026* (2006.01)

(52) U.S. Cl.
CPC .............. *H01S 5/026* (2013.01); *H01L 24/49* (2013.01); *H01L 2924/09701* (2013.01); *H01L 2924/12042* (2013.01)

(58) Field of Classification Search
USPC ....................................................... 333/202
See application file for complete search history.

(56) References Cited

U.S. PATENT DOCUMENTS

| | | | | |
|---|---|---|---|---|
| 9,866,928 | B2 * | 1/2018 | Huang | ............... H04Q 11/0001 |
| 2012/0293279 | A1 * | 11/2012 | Gong | ...................... H01P 3/121 |
| | | | | 333/202 |
| 2015/0214594 | A1 * | 7/2015 | Zhou | ................... H01P 1/20309 |
| | | | | 333/204 |
| 2017/0069943 | A1 * | 3/2017 | Chayat | ................ H01P 1/20345 |

* cited by examiner

*Primary Examiner* — Tremesha S Willis
(74) *Attorney, Agent, or Firm* — W&G Law Group

(57) ABSTRACT

The present disclosure provides a millimeter wave LTCC filter including system ground layers and metalized vias; two first perturbation metallized vias provided in a first substrate integrated waveguide unit and two second perturbation metallized vias provided in a second substrate integrated waveguide unit; the two first perturbation metallized vias are symmetrically provided on a first diagonal of the first closed resonant cavity with respect to a geometric center of the first closed resonant cavity; the two second perturbation metallized vias are symmetrically provided on a second diagonal of the second closed resonant cavity with respect to a geometric center of the second closed resonant cavity, and the first diagonal and the second diagonal are orthogonal to each other; a first port and a second port. Compared with the related art, the millimeter wave LTCC filter of the present disclosure is small in volume, large in bandwidth, and low in loss.

8 Claims, 3 Drawing Sheets

3a

3b

MILLIMETER WAVE LTCC FILTER

TECHNICAL FIELD

The present disclosure relates to an antenna, and more particularly, to a millimeter wave LTCC filter used in the field of communication electronic products.

BACKGROUND

The fifth generation mobile phone mobile communication standard is also known as the fifth generation mobile communication technology (5G). Future 5G networks are developing towards a direction of network diversification, broadband, integration and intelligence. With the popularization of various smart terminals, mobile data traffic will explode. With the gradual landing of 5G networks, mobile phone communication bands will increase significantly.

The millimeter wave full-frequency band of the 5G communication includes 26.5~29.5 GHz and a relative bandwidth of 10.7%, and corresponding related millimeter wave radio frequency systems require good rejection performance out of a band of DC~60 GHz. The millimeter wave filter made by the LTCC process has higher integration, a smaller device dimension and a lower loss, but it has strict requirements for processing of a metalized via.

Therefore, it is necessary to provide a new millimeter wave LTCC filter to solve the above problems.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present disclosure will be further illustrated with reference to the accompanying drawings and the embodiments.

Figure 1:
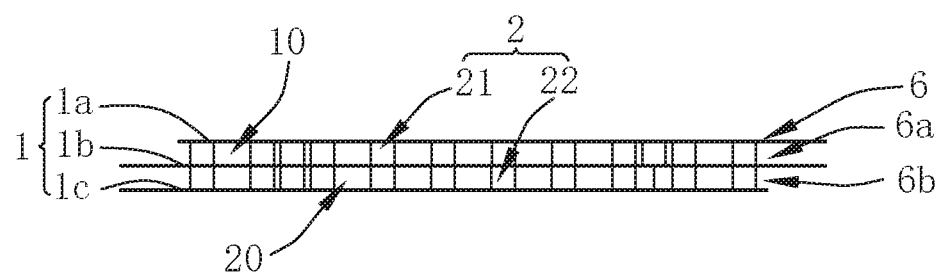
FIG. 1 is a perspective structural schematic diagram of a millimeter wave LTCC filter of the present disclosure.
Figure 2:
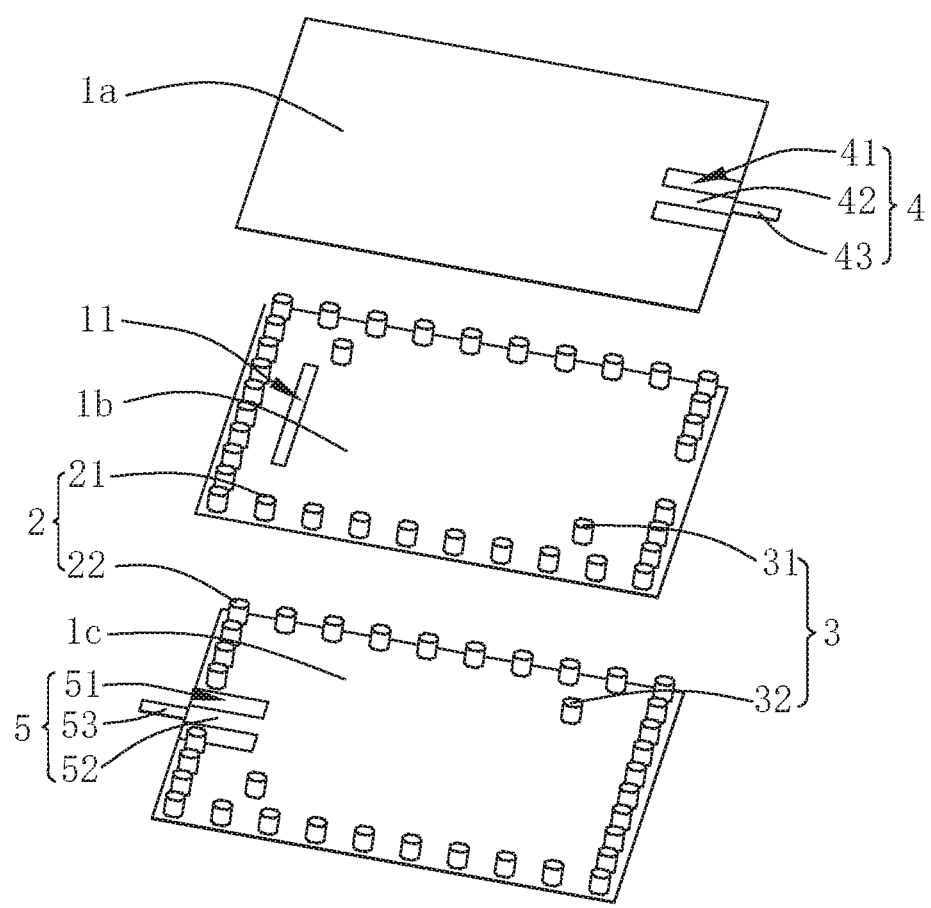
FIG. 2 is a partial exploded perspective structural schematic diagram of a millimeter wave LTCC filter of the present disclosure.

Referring to FIGS. 1-2, an embodiment of the present disclosure provides a millimeter wave LTCC filter 100. The millimeter wave LTCC filter 100 includes system ground layers 1, metallized vias 2, perturbation metallized vias 3, a first port 4, and a second port 5.

The system ground layers 1 include, sequentially stacked from top to bottom at intervals, a first system ground layer 1a, a second system ground layer 1b, and a third system ground layer 1c. In an embodiment, peripheral dimensions of the first system ground layer 1a, the second system ground layer 1b and the third system ground layer 1c are the same, and for example, they are all rectangles of the same size.

Two adjacent layers of the system ground layers 1 enclose one closed resonant cavity 6. Three layers of the system ground layers 1 sequentially enclose, from top to bottom, a first closed resonant cavity 6a and a second closed resonant cavity 6b, which have the same peripheral dimensions. The first closed resonant cavity 6a and the second closed resonant cavity 6b are both of a rectangular structure and are communicated with each other.

The metallized vias 2 include, in a stacking direction of the system ground layers 1, a plurality of first metallized vias 21 penetrating the first closed resonant cavity 6a, and a plurality of second metallized vias 22 penetrating the second closed resonant cavity 6b. The plurality of first metallized vias 21 and the plurality of second metallized vias 22 are respectively arranged right facing to each other. That is, the metallized vias 2 of the respective closed resonant cavities 6 are concentric hole structures.

In an embodiment, the plurality of first metallized vias 21 and the plurality of second metallized vias 22 corresponding thereto are concentric hole structures, and an aperture of the first metallized vias 21 is equal to an aperture of the second metallized vias 22.

In an embodiment, a center-to-center distance between two adjacent ones of the first metallized vias 21 is smaller than 2 to 2.5 times the aperture of the first metallized vias 21; a center-to-center distance of two adjacent ones of the second metallized vias 22 is smaller than 2 to 2.5 times the aperture of the second metallized vias 22.

In an embodiment, the first closed resonant cavity 6a is of a rectangular structure, and the plurality of first metallized vias 21 is equally spaced along a circumference of the first closed resonant cavity 6a, to enclose, for example, a rectangular structure.

The second closed resonant cavity 6b is of a rectangular structure, and the plurality of second metallized vias 22 is equally spaced along a circumference of the second closed resonant cavity 6b, to enclose, for example, a rectangular structure.

The first metallized vias 21 and the first closed resonant cavity 6a form a first substrate integrated waveguide unit 10, and the second metallized vias 22 and the second closed resonant cavity 6b form a second substrate integrated waveguide unit 20.

Referring to FIG. 2, in an embodiment, the second system ground layer 1b has a coupling gap 11 penetrating therethrough; the first closed resonant cavity 6a communicates with the second closed resonant cavity 6b through the coupling gap 11, that is, to form a coupling communication. The coupling gap 11 is located in a region enclosed by the second metallized vias 22.

In an embodiment, the coupling gap 11 is provided at a side of the second system ground layer 1b close to the second port 5.

The perturbation metallized vias 3 include two first perturbation metallized vias 31 provided in the first substrate integrated waveguide unit 10 and penetrating the first closed resonant cavity 6a in the stacking direction of the system ground layers 1, and two second perturbation metallized vias 32 provided in the second substrate integrated waveguide unit 20 and penetrating the second closed resonant cavity 6b in the stacking direction of the system ground layers 1. The two first perturbation metallized vias 31 are symmetrically provided on a first diagonal of the first closed resonant cavity 6a with respect to a geometric center of the first closed resonant cavity 6a; the two second perturbation metallized vias 32 are symmetrically provided on a second diagonal of the second closed resonant cavity 6b with respect to a geometric center of the second closed resonant cavity 6b, and the first diagonal of the first closed resonant cavity 6a and the second diagonal of the second closed resonant cavity 6b are orthogonal to each other.

In the above structure, the first perturbation metallized vias 31 and the second perturbation metallized vias 32 are introduced into the first closed resonant cavity 6a and the second closed resonant cavity 6b, respectively, so that two degenerate modes $TM_{102}$ and $TM_{201}$ can be excited in the closed resonant cavities, thereby achieving that a single closed resonant cavity 6 generates a two-order resonance and introduces two transmission zeros. Thus, two closed resonant cavities 6 generate a fourth-order resonance and introduce four transmission zeros, so that the rejection performance of out-of-band spurious signals is improved, and the number of required cavities is reduced by half while implementing multi-stage filtering, compared with a conventional manner.

The first port 4 is provided on one side of the first closed resonant cavity 6a to form a feed port structure.

The second port 5 is provided in the second closed resonant cavity 6b to form a feed port structure.

In an embodiment, the first port 4 includes a first clearance opening 41 formed by recessing inwardly from one side of the first system ground layer 1a. The first clearance opening 41 has an open end and a closed end. The first port 4 further includes a first microstrip line 42 that is received in the first clearance opening 41 and extends from the closed end of the first clearance opening 41 towards the open end of the first clearance opening 41, and a second microstrip line 43 extending from the first microstrip line 42 to the outside of the first system ground layer 1a.

The second port 5 includes a second clearance opening 51 formed by recessing inwardly from one side of the third system ground layer 1c. The second clearance opening 51 has an open end and a closed end. The second port 5 further includes a third microstrip line 52 that is received in the second clearance opening 51 and extends from the closed end of the second clearance opening 51 towards the open end of the second clearance opening 51, and a fourth microstrip line 53 extending from the third microstrip line 52 towards the outside of the third system ground layer 1c.

In an embodiment, the first port 4 is provided on a symmetry axis of the first system ground layer 1a. The second port 5 is provided on a symmetry axis of the third system ground layer 1c.

In an embodiment, the millimeter wave LTCC filter 100 further includes a dielectric plate layer sandwiched between two adjacent ones of the system ground layers. The dielectric plate layer is made of an LTCC material.

Figure 3:
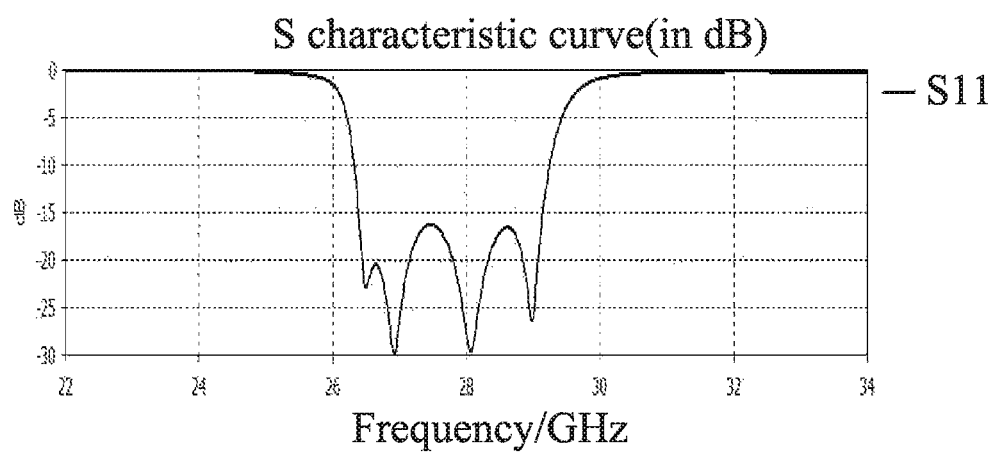
FIG. 3 illustrates an S characteristic parameter curve of a millimeter wave LTCC filter of the present disclosure.
Figure 3:
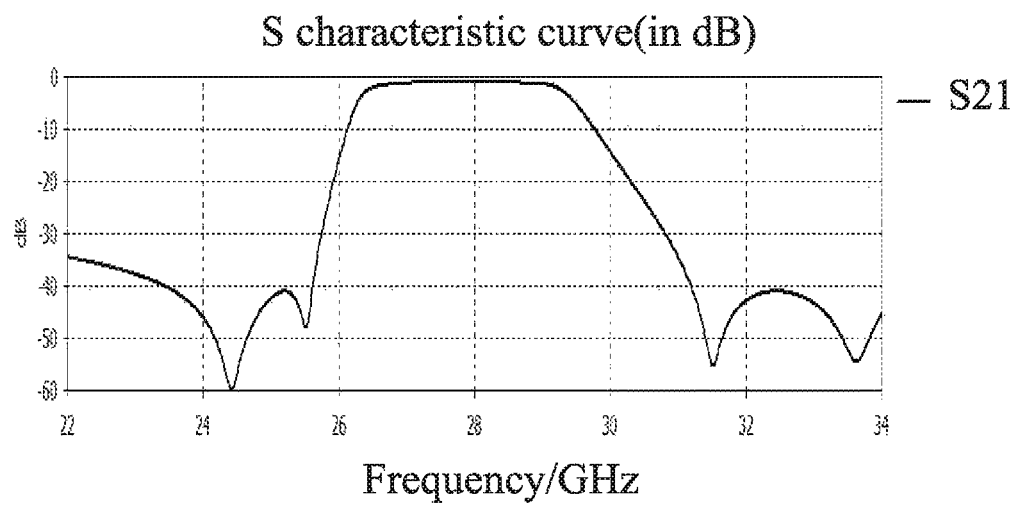

In combination with FIG. 3, FIG. 3a illustrates an S characteristic curve of the first port of the millimeter wave LTCC filter of the present disclosure, i.e., an S11 curve; and FIG. 3b illustrates an S characteristic curve of the second port of the millimeter wave LTCC filter of the present disclosure, i.e., an S21 curve. As can be seen from FIG. 3, in a frequency range of 26.38–29.14 GHz, a passband internal reflection coefficient of the millimeter wave LTCC filter of the present disclosure is smaller than −10 dB. Four transmission zeros (i.e., four perturbation metallized vias 3) are introduced, an out-of-band rejection is larger than 30 dB, and a maximum in-band insertion loss fluctuation is smaller than 0.3 dB, which meets the requirements of the radio frequency front end of the 5G millimeter wave communication system.

Compared to the related art, the millimeter wave LTCC filter of the present disclosure, by introducing a perturbation metallized via in each closed resonant cavity (the first closed resonant cavity and the second closed resonant cavity), can have two degenerate modes $TM_{102}$ and $TM_{201}$ excited in the closed resonant cavities, thereby achieving that a single closed resonant cavity generates a two-order resonance and two transmission zeros are introduced. Thus, two closed resonant cavities generate a fourth-order resonance and introduce four transmission zeros, so that the rejection performance of out-of-band spurious signals is improved, and the number of required cavities is reduced by half while implementing multi-stage filtering, compared with a conventional manner. In addition, a non-resonant mode, i.e., a $TM_{101}$ mode can also be excited in each closed resonant cavity. The $TM_{101}$ mode, the $TM_{102}$ mode and the $TM_{201}$ mode cancel each other at the ports to obtain two transmission zeros outside the LTCC filter passband, thereby greatly improving the out-of-band rejection. The millimeter wave LTCC filter of the present disclosure has a small volume, a wide bandwidth, and high out-of-band rejection.

The above are merely embodiments of the present disclosure, and the present disclosure is not limited thereto. It should be noted herein that equivalent structures or equivalent flow variations made without departing from the contents of the description and drawings of the present disclosure, or direct or indirect applications in other related technical fields, shall all fall within the protection scope of the present disclosure.

What is claimed is:

1. A millimeter wave LTCC filter, comprising:
system ground layers, comprising a first system ground layer, a second system ground layer, and a third system ground layer that are sequentially stacked from top to bottom at intervals, wherein two adjacent layers of the system ground layers define one closed resonant cavity; three layers of the system ground layers sequentially define, from top to bottom, a first closed resonant cavity and a second closed resonant cavity that have same peripheral dimensions and communicate with each other; and each of the first closed resonant cavity and the second closed resonant cavity is of a rectangular structure;
metallized vias, comprising, in a direction in which the system ground layers are stacked, a plurality of first metallized vias penetrating the first closed resonant cavity, and a plurality of second metallized vias penetrating the second closed resonant cavity, wherein the plurality of first metallized vias is equally spaced along a circumference of the first closed resonant cavity; the plurality of second metallized vias is equally spaced along a circumference of the second closed resonant cavity; the plurality of first metallized vias and the first closed resonant cavity form a first substrate integrated waveguide unit; and the plurality of second metallized vias and the second closed resonant cavity form a second substrate integrated waveguide unit;
perturbation metallized vias comprising two first perturbation metallized vias provided in the first substrate integrated waveguide unit and penetrating the first closed resonant cavity in the direction in which the system ground layers are stacked, and two second perturbation metallized vias provided in the second substrate integrated waveguide unit and penetrating the second closed resonant cavity in the direction in which the system ground layers are stacked, wherein the two first perturbation metallized vias are symmetrically provided on a first diagonal of the first closed resonant cavity with respect to a geometric center of the first closed resonant cavity; the two second perturbation metallized vias are symmetrically provided on a second diagonal of the second closed resonant cavity with respect to a geometric center of the second closed resonant cavity, and the first diagonal of the first resonant cavity and the second diagonal of the second resonant cavity are orthogonal to each other;

a first port provided on one side of the first closed resonant cavity; and a second port provided on one side of the second closed resonant cavity opposite to the first port.

2. The millimeter wave LTCC filter as described in claim 1, wherein the first port comprises a first clearance opening formed by recessing inwardly from one side of the first system ground layer, the first clearance opening has an open end and a closed end, and the first port further comprises: a first microstrip line that is received in the first clearance opening and extends from the closed end of the first clearance opening towards the open end of the first clearance opening, and a second microstrip line extending from the first microstrip line towards outside of the first system ground layer; the second port comprises a second clearance opening formed by recessing inwardly from one side of the third system ground layer, the second clearance opening has an open end and a closed end, and the second port further comprises: a third microstrip line that is received in the second clearance opening and extends from the closed end of the second clearance opening towards the open end of the second clearance opening, and a fourth microstrip line extending from the third microstrip line towards outside of the third system ground layer.

3. The millimeter wave LTCC filter as described in claim 2, wherein the first port is provided on a symmetry axis of the first system ground layer, and the second port is provided on a symmetry axis of the third system ground layer.

4. The millimeter wave LTCC filter as described in claim 1, wherein the plurality of first metallized vias and the plurality of second metallized vias face right to each other to form concentric hole structures; and an aperture of each of the plurality of first metallized vias is equal to an aperture of each of the plurality of second metallized vias.

5. The millimeter wave LTCC filter as described in claim 4, wherein a center-to-center distance between two adjacent ones of the plurality of first metallized vias is smaller than 2 to 2.5 times the aperture of each of the plurality of first metallized vias; and a center-to-center distance between two adjacent ones of the plurality of second metallized vias is smaller than 2 to 2.5 times the aperture of each of the plurality of second metallized vias.

6. The millimeter wave LTCC filter as described in claim 1, wherein the second system ground layer has a coupling gap penetrating therethrough; and the first closed resonant cavity communicates with the second closed resonant cavity through the coupling gap.

7. The millimeter wave LTCC filter as described in claim 6, wherein the coupling gap is provided on a side of the second system ground layer close to the second port.

8. The millimeter wave LTCC filter as described in claim 1, further comprising a dielectric plate layer sandwiched between two adjacent ones of the system ground layers, and the dielectric plate layer is made of an LTCC material.

* * * * *